United States Patent [19]

Frankeny

[11] Patent Number: 5,712,583
[45] Date of Patent: Jan. 27, 1998

[54] CLOCK PHASE ALIGNMENT USING FREQUENCY COMPARISON

[75] Inventor: Richard Francis Frankeny, Elgin, Tex.

[73] Assignee: International Business Machines Corporation, Armonk, N.Y.

[21] Appl. No.: 556,251

[22] Filed: Nov. 13, 1995

[51] Int. Cl.$^6$ .............................. H03L 7/06; H03K 5/13
[52] U.S. Cl. .................... 327/158; 327/277; 327/161
[58] Field of Search ..................... 327/149, 153, 327/154, 155, 156–159, 161–163, 232, 233, 234–236, 237, 243–245, 250, 251, 256, 257, 261, 276, 277, 284, 263, 299, 291

[56] References Cited

U.S. PATENT DOCUMENTS

| | | | |
|---|---|---|---|
| 4,755,704 | 7/1988 | Flora et al. | 327/152 |
| 4,795,985 | 1/1989 | Gailbreath, Jr. | 327/158 |
| 4,868,514 | 9/1989 | Azevedo et al. | 327/159 |
| 4,922,141 | 5/1990 | Lofgren et al. | 327/158 |
| 5,087,829 | 2/1992 | Ishibashi et al. | 327/152 |
| 5,105,108 | 4/1992 | Ngo | 327/158 |
| 5,148,113 | 9/1992 | Wight et al. | 3327/3 |
| 5,231,319 | 7/1993 | Crafts et al. | 327/277 |
| 5,237,224 | 8/1993 | DeLisle et al. | 327/276 |
| 5,298,866 | 3/1994 | Kaplinsky | 327/261 |
| 5,305,451 | 4/1994 | Chao et al. | 327/144 |
| 5,355,037 | 10/1994 | Andresen et al. | 327/158 |
| 5,420,544 | 5/1995 | Ishibashi | 327/156 |
| 5,428,309 | 6/1995 | Yamauchi et al. | 327/156 |

Primary Examiner—Timothy P. Callahan
Assistant Examiner—Eunja Shin
Attorney, Agent, or Firm—Casimer K. Salys

[57] ABSTRACT

Systems and methods for phase aligning the clocks signal transmitted from a source to multiple destination devices over individual transmission lines of differing impedance. According to the invention, each clock signal transmission line has associated therewith a matching pair of transmission lines connected to oscillate as a dummy loop. Matching programmable delay lines are connected in series with the clock signal line and the dummy loop lines, the delay lines being commonly controlled in response to a frequency comparison between the oscillation on the dummy loop and a direct subharmonic of the clock frequency. When the oscillation frequency of the dummy loop and the subharmonic of the base clock frequency match, the clock signal at the destination chip is phase aligned to the base clock signal at the clock chip, though shifted by one clock period. Clock signal phase alignment is automated for each destination chip subject to individualized control and is thereby automatically responsive to thermal or other changes at the clock chip or individual destination chips.

15 Claims, 5 Drawing Sheets

CLOCK PHASE ALIGNMENT USING FREQUENCY COMPARISON

BACKGROUND OF THE INVENTION

The present invention relates generally to the alignment of clock signals. More particularly, the invention is directed to phase aligning clock signals using voltage control delays and frequency comparison.

The accurate alignment of clock signals, and particularly the edges of clock pulses, is a subject of acute concern to designers of digital computer systems. Clock synchronized computer printed circuit boards routinely operating at greater than 100 MHz. Such clock rates presently require that the wiring layouts or integrated circuit chip logic be refined to compensate for inconsistent delays in the distribution of the clock signal from the clock chip to the diversely located chips or logic devices on the printed circuit board. Techniques have been developed to selectively introduce delays along short clock signal paths and to compensate for phase misalignments of clocked signals arriving along different paths.

In addition, phase locked loops are often used to adjust for clock skew within the individual integrated circuit chips, where impedance and gate delay effects introduce clock signal skews. An example of such phase locked loop implementation is described in the textbook Circuit Interconnection and Packaging for VLSI by Bakoglu, as specifically described in Chapter Section 8.6 thereof. However, such phase locked loop implementations cannot compensate for skew due to board wiring and packaging in the signal paths between the clock chip, or external clock source, and the actual pin inputs to the individual chips. The skews introduced into clock signals between the origin of the clock pulses and the inputs to the chips are the result of the transmission line characteristics of the individual clock lines.

One form of the problem is illustrated in FIG. 1 of the drawings. FIG. 1 depicts a physical distribution of chips as might appear on a printed circuit board driven by a common clock signal. In particular, FIG. 1 shows clock chip 1 with a multiplicity of output buffers or drivers 2 providing the clock signal to multiple lines. The lines project along paths of different length and impedance from the output pins of the clock chip to the input pins of individual integrated circuit chips, identified by reference numerals 3, 4, 6, and 7. Selected outputs from chips 3, 4, 6, and 7 thereafter undergo logical combination in logic block 8, which can itself be an integrated circuit chip or be composed of discrete devices. Clearly, if the clock signals to the individual chips arrive skewed as a consequence of transmission line effects, the combination of such clock synchronized signals as performed in logic block 8 must compensate for worse case skew effects. Unfortunately, that makes the design materially more complex and potentially subject to spurious errors. Furthermore, since the depiction in FIG. 1 is highly simplified, the implications of clock skew become quite significant as the number of clock synchronized operations increase and the clock frequency is elevated.

Therefore, there exists a need for systems and methods by which the clock signal skews on individually distributed clock lines to diversely situated chips can be independently adjusted to accurately align all the clock pulse edges at the destination chips.

SUMMARY OF THE INVENTION

According to one aspect of the invention, single phase clock signals are synchronized at distinct destinations by oscillating a transmission line loop using a first programmed delay line, the loop extending along a clock signal transmission line between the source of the clock signal and a destination for the clock signal, delaying the clock signal over the clock signal transmission line using a second programmable delay line, and controlling the first and second programmable delay lines in a proportion which provides a one clock period time delay of the clock signal over the clock signal transmission line, the control being responsive to a frequency comparison between the clock signal and the oscillation on the transmission line loop.

In another form, the invention relates to phase aligning a single phase clock signal at a destination separated by transmission line from the source of the clock signal through the steps of passing a clock signal through a first programmable delay line, at the source of the clock signal, and over a first transmission line to the destination, creating an oscillation over a pair of dummy transmission lines, each substantially matching the first transmission line, using a second programmable delay line at the source and operating at a subharmonic of the first frequency, detecting differences between the frequencies of the oscillations on the pair of dummy transmission lines and a directly generated subharmonic of the source clock signal frequency, and controlling the programmable delay lines using the detected differences in frequencies to relate the subharmonic created by the oscillation to the subharmonic of the clock signal frequency.

The invention also relates to a system for phase aligning a single phase clock signal at a destination separated by a first transmission line from the source of the clock signal, comprised of a means for creating an oscillation on a pair of dummy transmission lines extending along the path of the first transmission line using a first programmable delay line, a second programmable delay line in series with the first transmission line, and frequency comparator means for concurrently controlling the first and second programmable delay lines to provide a one clock period time delay in the clock signal at the destination.

A particular implementation of the invention involves the practice of distributing a single phase clock to multiple integrated circuit chips situated at diverse locations on a printed circuit board from the clock signal source, a clock chip. Individual clock transmission lines are defined between the clock source and each destination chip. A dummy loop, composed of two transmission lines, is formed adjacent to the clock transmission line. Each line of the dummy loop has an impedance closely matching the clock signal transmission line. Oscillation of the dummy loop is controlled in an output buffer or driver circuit at the clock chip. The clock signal transmission line and each line of the dummy loop has a programmable delay line connected in series. The programmable delay lines have matching characteristics and have a common control input line. The control signal to the programmable delay lines is derived from a frequency comparator which compares the oscillation frequency in the dummy loop to a directly derived subharmonic of the clock signal, preferably at one-fourth the clock signal rate.

The programmable delay lines are accurately matched in characteristics being that they are designed and fabricated on the same clock chip. With matching programmable delay lines, matching amplifiers at the destination chip, and matching characteristics in the transmission lines between the clock chip and the destination chip, the frequency comparator accurately phase aligns a one period delayed clock signal edge at the destination chip.

In furtherance of this implementation, a clock transmission line, dummy loop, programmable delay lines, and frequency comparators are established for each destination chip receiving the clock signal. Thereby, the clock signals as appear on each destination chip are precisely aligned in phase notwithstanding individualized differences in the impedance paths between the clock chip and each respective destination chip.

These and other features of the invention will be more clearly understood and appreciated upon considering the detailed description which follows hereinafter.

DESCRIPTION OF THE PREFERRED EMBODIMENT

Figure 1:
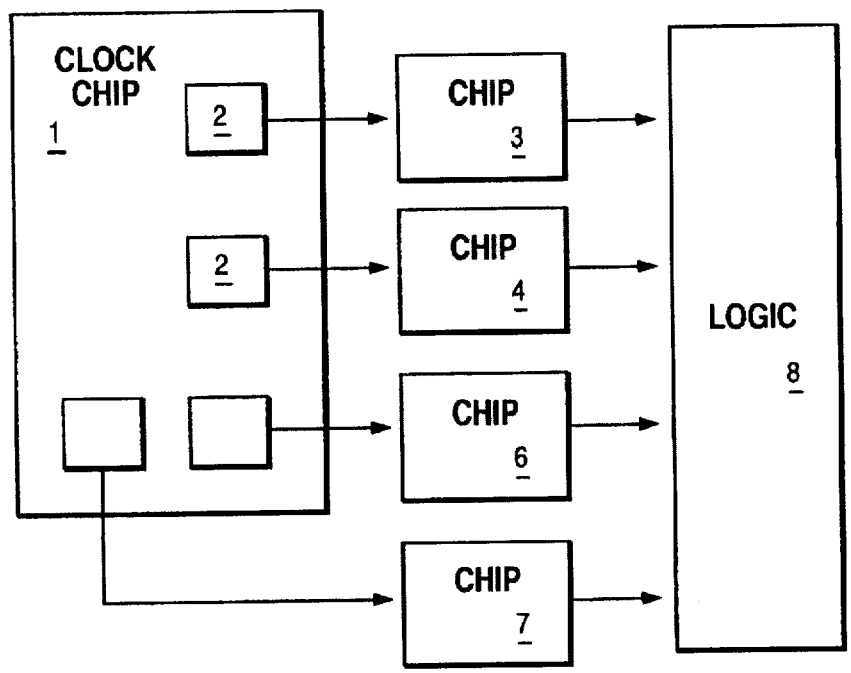
FIG. 1 is a schematic diagram of chips as might be distributed on a computer printed circuit board.
Figure 2:
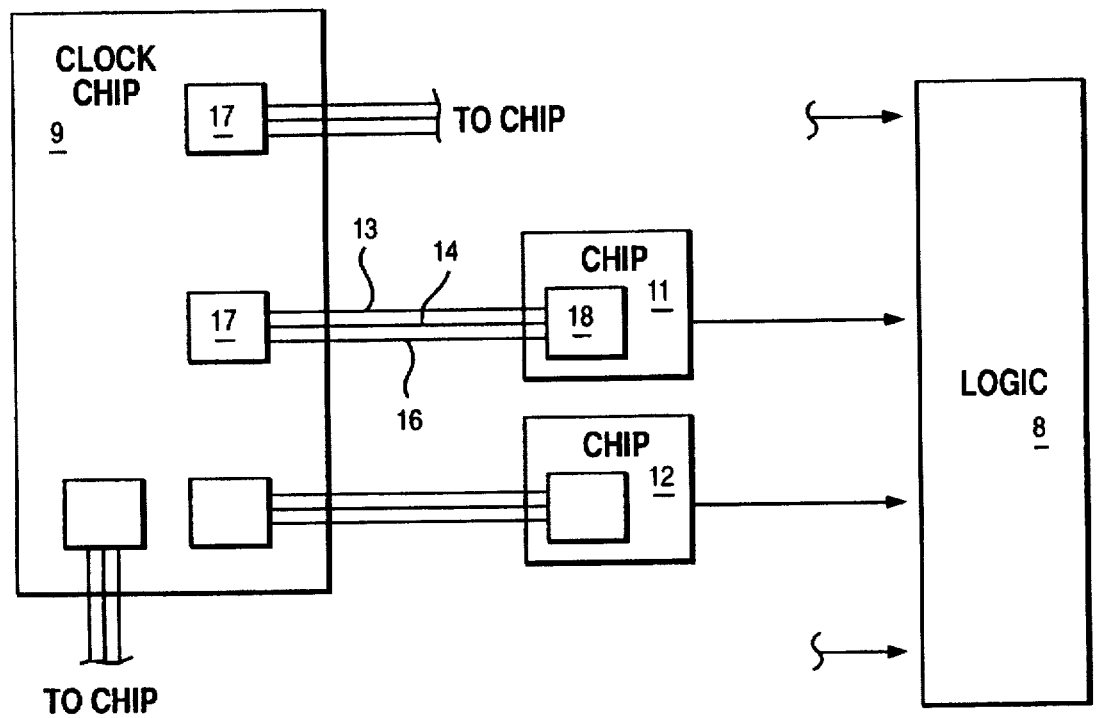
FIG. 2 is a schematic depicting part of the board shown in FIG. 1, as supplemented to implement the clock phase alignment of the present invention.

The printed circuit board and related chip layout described with reference to FIG. 1 is partially replicated in FIG. 2 as modified to practice the present invention. Namely, the clock signal connections between clock chip 9 and destination chips 11 and 12 shown to be composed of three transmission lines, individually identified as reference numerals 13, 14, and 16 for chip 11. A corresponding set of three transmission lines is used to convey clock signals to depicted chip 12, and to other chips (not shown). As suggested by the depiction in FIG. 2, the three transmission lines are physically situated in close proximity. The objective is to ensure that the physical placement creates substantially identical impedance characteristics in the three lines.

One of the three transmission lines conveys the actual clock signal from the clock chip to the destination chip, while the other two define a dummy loop. The characteristics of the dummy loop, and correspondingly the clock signal transmission line, are detected through feedback oscillation and used to actively control the phase alignment of the clock signal as appears on the clock signal transmission line.

Operationally, output buffer/driver 17 uses the dummy loop to sense the delay of the transmission line and its line drivers/receivers. A closed loop control then adjusts the delay in the clock signal transmission line from clock chip to the receiver chip to be 1 clock period. In this way, the clock signal as received in destination chip 11 is phase aligned to the clock signal as received in more proximate destination chip 12. This simplifies the combination of clock synchronized signals accomplished in logic block 8. Active compensation is provided for each individual clock transmission line to ensure that the clock signal at each destination chip is phase aligned, notwithstanding the differences in the clock signal transmission line characteristics from the clock chip.

Figure 3:
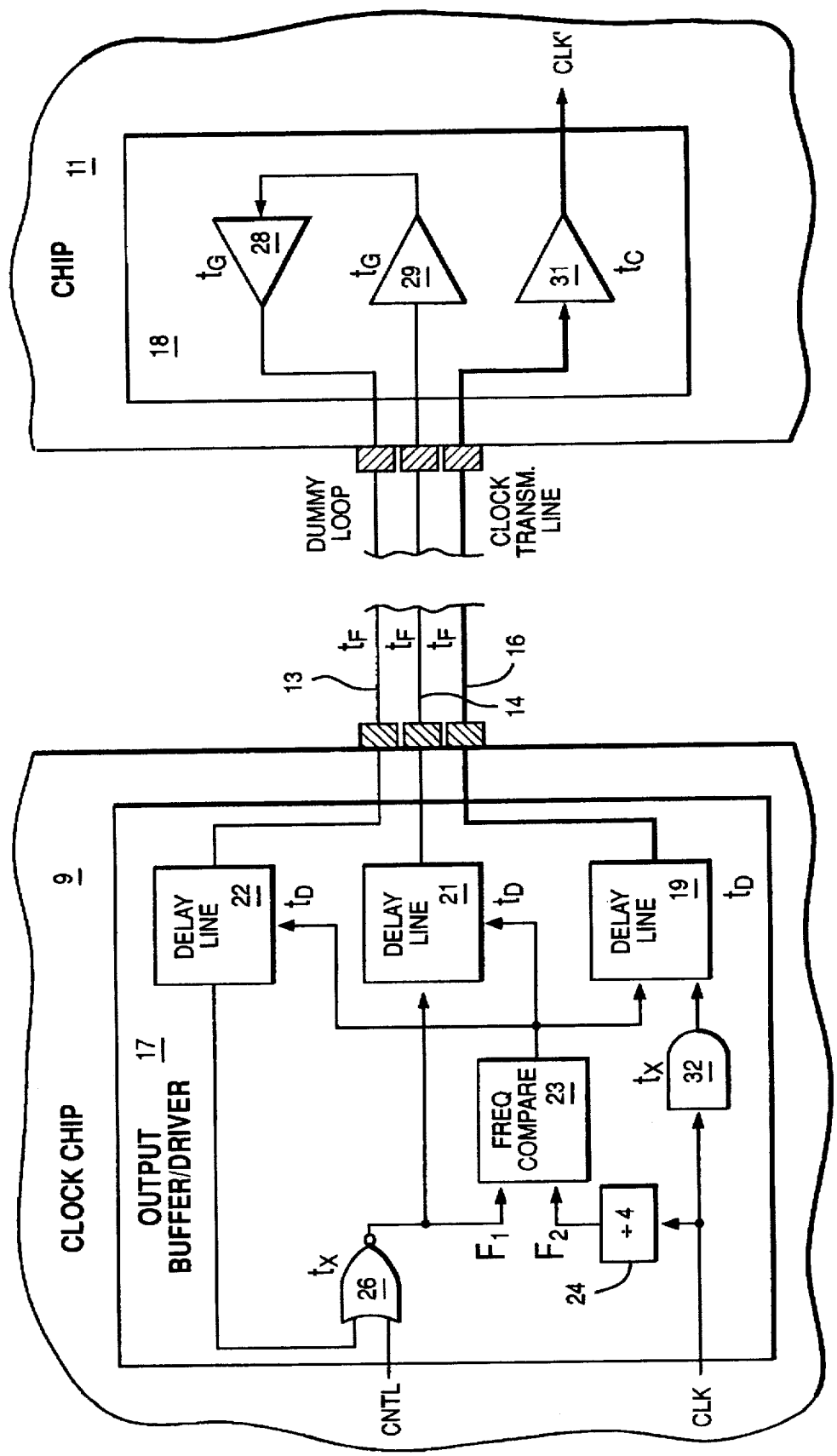
FIG. 3 schematically illustrates the functional elements by which the invention may be practiced as relates to the clock chip and a destination chip.
Figure 4:
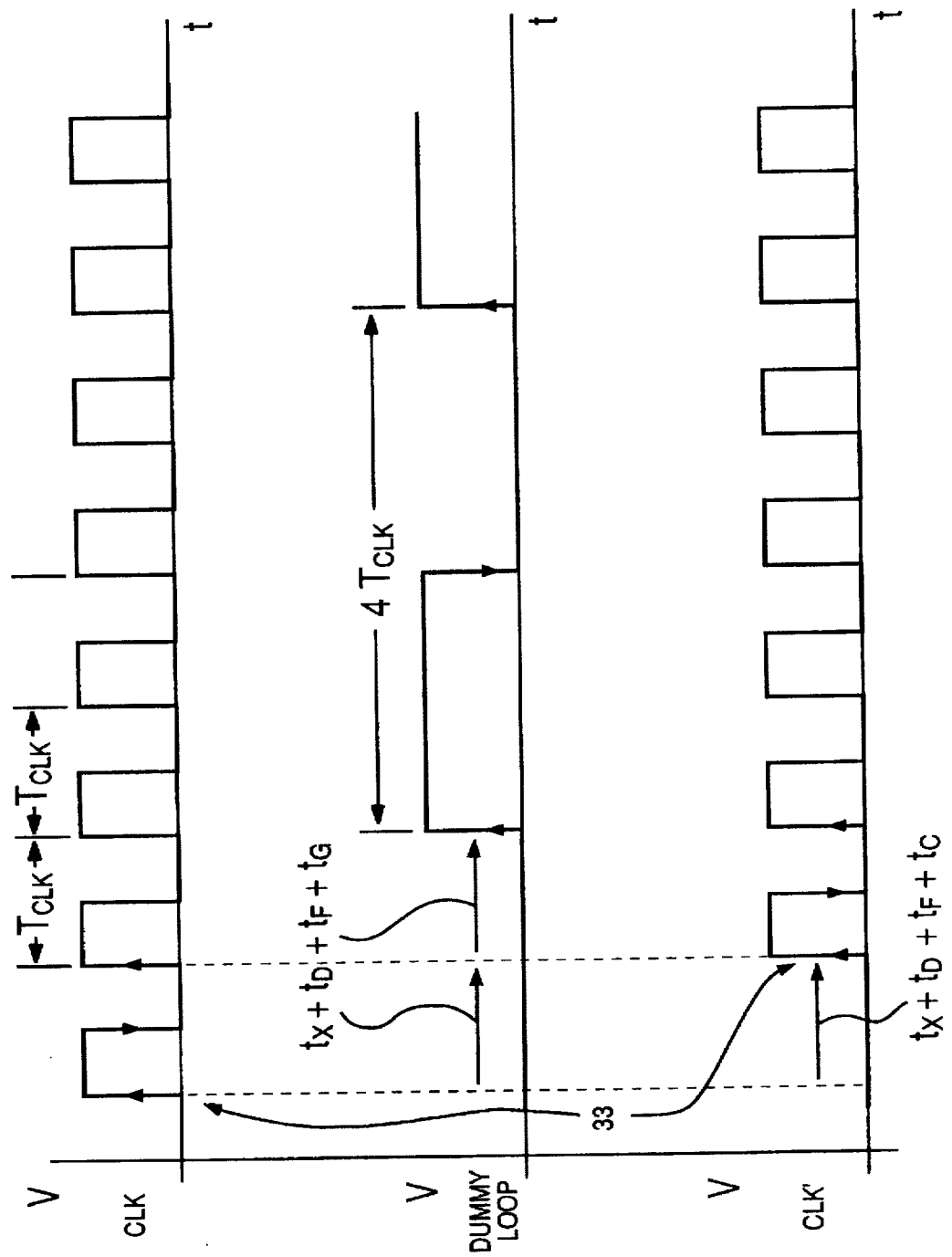
FIG. 4 is a schematic depicting waveforms of clock signals within the system depicted in FIG. 3.

FIG. 3 illustrates by functional block diagram the elements in output buffer/drive 17 of clock chip 9, as well as the elements in input buffer 18 of destination chip 11. Also shown are clock signal transmission line 16 and dummy loop transmission lines 13 and 14. Lines 13 and 14 physically and electrically match clock transmission line 16. Waveforms characterizing the phase alignment system depicted in FIG. 3 are shown in FIG. 4 of the drawings.

The clock phase alignment system depicted in FIG. 3 includes an output buffer/driver 17 within clock chip 9 for each destination chip receiving aligned clock signals. Each output/buffer driver 17 has a set of matching programmable delay lines 19, 21 and 22, commonly controlled by the output of frequency comparator 23. Frequency comparator 23 generates an output voltage proportional to the difference between frequencies $f_1$ and $f_2$, where $f_1$ is the feedback sustained oscillation of the dummy transmission line loop, and $f_2$ is a directly derived subharmonic of the base clock signal CLK. As shown in FIG. 3, $f_2$ is the base clock signal CLK divided by 4 in block 24. Enablement control signal CNTL is combined with the feedback signal provided over the dummy loop in NOR gate 26 to selectively enable and disable the oscillation of the dummy loop. Since the control loop is low speed exotic techniques for frequency comparison using counters and D/As are possible depending on accuracy desired.

Transmission lines 13, 14 and 16 connect clock chip 9 to destination chip 11 using printed circuit board patterns or cables which provide substantially identical impedance characteristics for all three transmission lines. Since the active compensation system which provides phase alignment in the present invention utilizes the dummy loop to derive the effective delay characteristics of the clock signal transmission line loop, the objective is to make the three transmission lines substantially identical.

Input buffer 18 of destination chip 11 includes a pair of matching amplifiers 28 and 29, and a further matching clock signal amplifier 31. The output of amplifier 31 is the phase aligned clock signal CLK'.

Enablement of the oscillation in the dummy loop commences with a low state on the control signal CNTL. The frequency of oscillation is dictated by the cumulative time delays in the feedback path defined by the dummy loop. As shown in FIG. 3, that period is comprised of $2t_X+2t_D+2t_F+2t_G$. In the path of the clock signal CLK, the time delays are composed of $t_X+t_D+t_F+t_C$.

Integrated circuit fabrication practices have established that identical electronic circuits on common integrated circuit chips are highly matched in parameters. This matching of characteristics appears in destination chip 11, where the delays $t_G$ and $t_C$ can be accurately matched by making amplifiers 28, 29 and 31 as close to identical as possible. The same situation applies to programmable delay lines 19, 21 and 22, in that they use the same circuit and reside in close proximity on the same clock chip 9. The dummy loop and clock signal transmission lines are physically formed to exhibit substantially identical impedance characteristics and a corresponding match of the time delay $t_F$.

Adjustments in programmable delay lines 19, 21, and 22 ensure that the oscillation frequency of the dummy loop is a direct subharmonic of the frequency defined by the clock signal CLK. Once the subharmonic relationship is precisely established and controlled, the matched delay in the clock signal transmission line ensures a precise phase relationship between clock signal CLK at the clock chip and the signal CLK' in destination chip 11.

The timing and signal phase relationships are discernable from the waveforms depicted in FIG. 4. The first plot shows the waveform of the base clock signal CLK, and its associated period $T_{CLK}$. The second waveform illustrates the oscillation on the dummy loop when frequencies $f_1$ and $f_2$ (FIG. 3) match. Note that the dummy loop frequency is one-fourth the clock frequency and as such exhibits a period of $4T_{CLK}$. Also illustrated is the fact that each state (0 or 1) of the signal on the dummy loop is composed of two time delays, one for each direction in the dummy loop, with each being a sum of time periods $t_X+t_D+t_F+t_G$.

The clock signal at the destination chip, CLK' is delayed, as noted by reference numeral 33, from the corresponding clock signal CLK by a time interval composed of $t_X+t_D+t_F+t_C$. Therefore, when the time delays match, and $t_G$ is equal to $t_C$, then the phase of clock signal CLK' is aligned with the phase of clock signal CLK, although the actual occurrence of clock signal CLK' is $T_{CLK}$ delayed from the occurrence of the base clock signal CLK.

Referring momentarily back to FIG. 3, note that each destination clock chip 11 and 12 has its own buffer/driver 17 in clock chip 9, and its own input buffer 18 at destination chip 11. Thus, customized and active delay line phase compensation is provided to each destination chip. Furthermore, if thermal effects modify the characteristics of the transmission line or the circuits within individual chips, the active clock phase alignment system of the present invention compensates accordingly.

Figure 5:
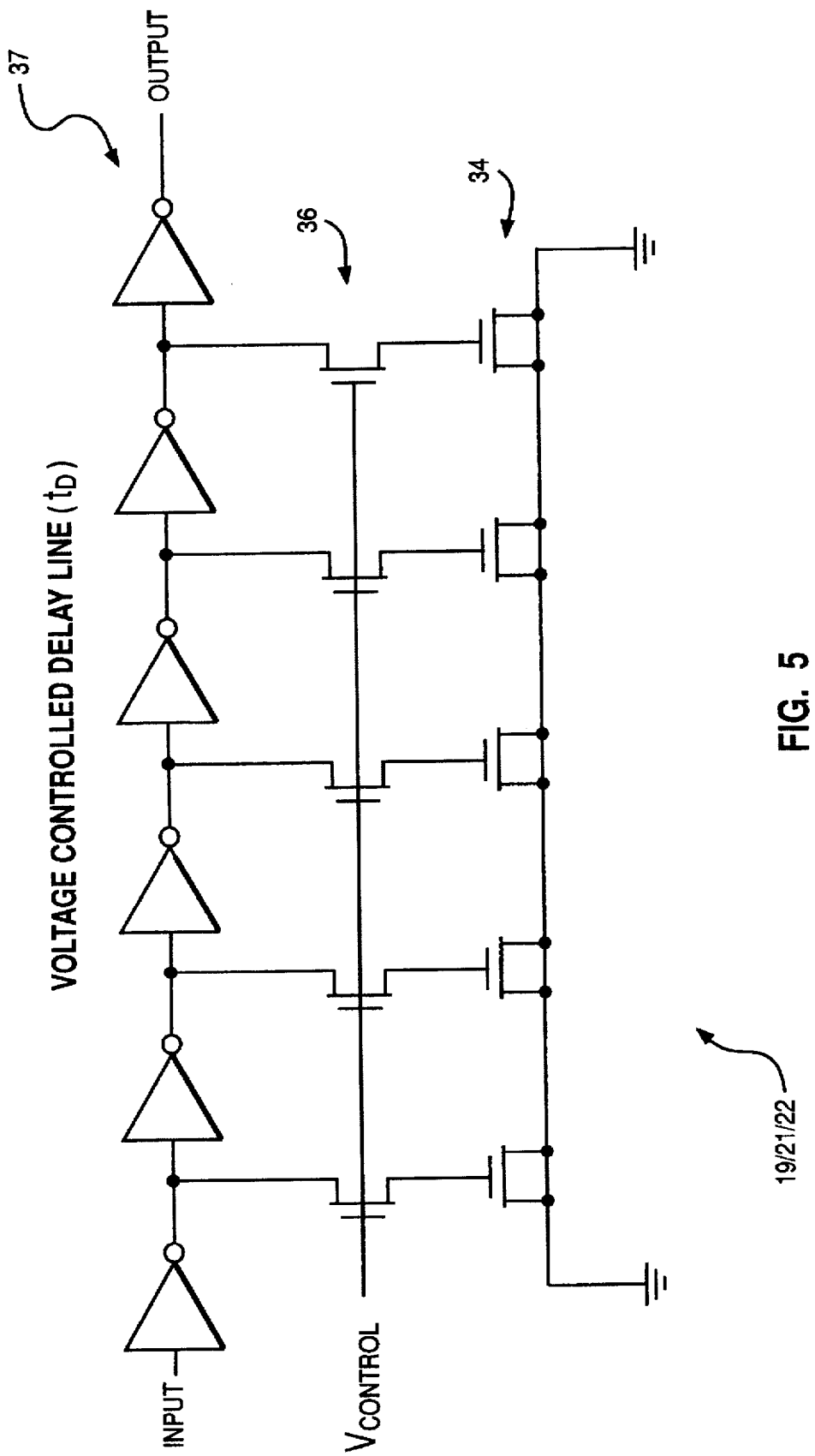
FIG. 5 schematically depicts a representative programmable delay line circuit.

FIG. 5 illustrates by electronic schematic a representative voltage controlled programmable delay line 19/21/22. Field effect transistors 34 are connected as capacitors which are apportioned through field of transistors 36 in response to control voltage $V_{CONTROL}$. The delay through inverters 37, between the input and the output, is proportional to the capacitance invoked by $V_{CONTROL}$. Note, the present embodiment utilizes a configuration with an even number of inverters 37.

Figure 6:
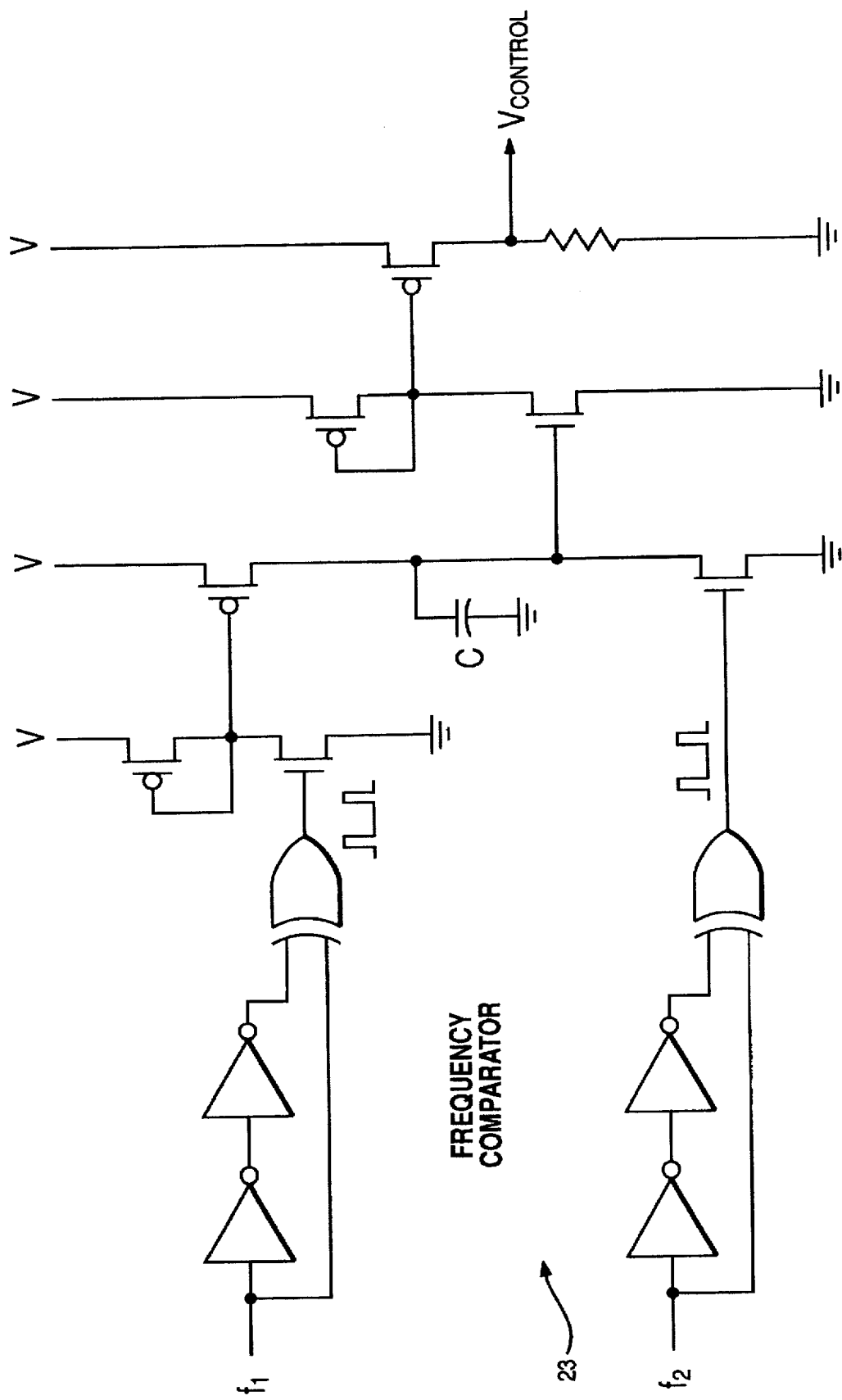
FIG. 6 schematically depicts a representative frequency comparator circuit.

FIG. 6 depicts by electronic schematic an example of frequency comparator 23 (FIG. 3). As implemented, the voltage across capacitor C is proportional to the difference between frequencies $f_1$ and $f_2$. Control voltage $V_{CONTROL}$ is derived directly from the voltage across the capacitor.

As noted earlier with reference to FIG. 3, the operation of the present active clock phase alignment system contemplates matching characteristics in programmable delay lines 19, 21 and 22. Therefore, though delay lines 21 and 22 are shown as distinctive blocks, they may be merged into a single unit if the composite accurately provides twice the delay of delay line 19 over the controllable range.

The present invention is particularly suited to the needs of contemporary high clock frequency printed circuit board designs with multiple synchronously operable chips physically dispersed over the board. The invention compensates for differences in the clock signal transmission lines by which the clock signal is distributed to the individual chips.

Though the invention has been described and illustrated by way of a specific embodiment, the systems and methods encompassed by the invention should be interpreted to be in keeping with the breadth of the claims set forth hereinafter.

I claim:

1. A method of phase aligning a clock signal, comprising the steps of:
    oscillating a transmission line loop, composed of multiple transmission lines, and a first programmable delay line, the loop extending along a clock signal transmission line between the source of the clock signal and a destination for the clock signal;
    delaying the clock signal over the clock signal transmission line using a second programmable delay line; and
    controlling the first and second programmable delay lines in a proportion which provides a one clock period time delay of the clock signal over the clock signal transmission line, the control being responsive to a frequency comparison between the clock signal and the oscillation on the transmission line loop.

2. The method recited in claim 1, wherein the net time delay of the first programmable delay line is twice the time delay of the second programmable delay line.

3. The method recited in claim 2, wherein the frequency comparison is between a subharmonic of the clock signal and a base oscillation frequency on the transmission line loop.

4. The method recited in claim 3, wherein the oscillation on the transmission line loop is at one fourth the frequency of the clock signal and uses a feedback signal from the destination transmitted over one line of the multiple transmission lines of the loop.

5. The method recited in claim 4, wherein the first programmable delay line is comprised of an output programmable delay line and an input programmable delay line, having delay line characteristics which match each other and the second programmable delay line.

6. A method of phase aligning a clock signal at a destination separated by a transmission line from the source of the clock signal, comprising the steps of:
    passing a clock signal through a first programmable delay line, at the source of the clock signal, and over a first transmission line to the destination;
    creating an oscillation over a pair of dummy transmission lines, each extending along and substantially matching the first transmission line, using a second programmable delay line at the source and operating at a subharmonic of the clock signal frequency;
    detecting differences between the frequencies of the oscillations on the pair of dummy transmission lines and a directly generated subharmonic of the source clock signal frequency; and
    controlling the programmable delay lines using the detected difference in frequencies to relate the subharmonic created by the oscillation to the subharmonic of the clock signal frequency.

7. The method recited in claim 6, wherein the net time delay of the second programmable delay line is twice the time delay of the first programmable delay line.

8. The method recited in claim 7, wherein the detected differences between frequencies is accomplished in a frequency comparator sensing the oscillation on the pair of dummy transmission lines and one fourth the clock signal frequency.

9. The method recited in claim 8, wherein the oscillation on the pair of dummy transmission lines is at one fourth the frequency of the clock signal and uses a feedback signal from the destination transmitted over one of the dummy transmission lines.

10. The method recited in claim 9, wherein the second programmable delay line is comprised of an output programmable delay line and an input programmable delay line, having delay line characteristics which match each other and the first programmable delay line.

11. A system for phase aligning a clock signal at a destination, comprising:
    means for transmitting the clock signal from a source to the destination over a first transmission line;
    means for creating an oscillation on a pair of dummy transmission lines, the dummy transmission lines extending along the path of the first transmission line, using a first programmable delay line;

second programmable delay line in series with the first transmission line; and frequency comparator means for concurrently controlling the first and second programmable delay lines to provide a one clock period time delay in the clock signal at the destination.

12. The system recited in claim 11, wherein the net time delay of the first programmable delay line is twice the time delay of the second programmable delay line.

13. The system recited in claim 12, wherein the frequency comparator means compares a subharmonic of the clock signal and a base oscillation frequency on the pair of dummy transmission lines.

14. The system recited claim 13, wherein the oscillation on the pair of dummy transmission lines is at one fourth the frequency of the clock signal and uses a feedback signal from the destination transmitted over one line of the pair.

15. The system recited in claim 14, wherein the first programmable delay line is comprised of an output programmable delay line and an input programmable delay line, having delay line characteristics which match each other and the second programmable delay line.

* * * * *